United States Patent [19]

Purser

[11] Patent Number: 5,693,939

[45] Date of Patent: Dec. 2, 1997

[54] MEV NEUTRAL BEAM ION IMPLANTER

[76] Inventor: Kenneth H. Purser, 365 N. Emerson Rd., Lexington, Mass. 02173

[21] Appl. No.: 675,567

[22] Filed: Jul. 3, 1996

[51] Int. Cl.$^6$ .................................................. H01J 37/317
[52] U.S. Cl. ........................... 250/251; 250/492.21
[58] Field of Search ........................ 250/251, 492.21

[56] References Cited

U.S. PATENT DOCUMENTS

| | | | |
|---|---|---|---|
| 4,434,131 | 2/1984 | Dagenhart et al. | 250/251 |
| 5,300,891 | 4/1994 | Tokoro | 328/233 |
| 5,352,899 | 10/1994 | Golovanivsky et al. | 250/492.21 |

OTHER PUBLICATIONS

Nuclear Instruments and Methods in Physics Research B55 (1991) pp. 434–438; N.Tokoro, et al.; "The beam performance of the Genus G-1500 ion implanter".

*Primary Examiner*—Jack I. Berman
*Attorney, Agent, or Firm*—Nields & Lemack

[57] ABSTRACT

This invention relates to a method and apparatus for the direct current acceleration of ions of all species to energies as high as a few million electron volts (MeV). This invention has particular relevance for the controlled doping of semiconductor materials and flat panel display units where MeV doping may be needed for the production of deep wells, isolation layers, the sub-circuit crystal damage that is useful for gettering unwanted impurity atoms and for the developments of etch pits. The apparatus disclosed uses an acceleration procedure that employs high velocity neutral beams of dopant atoms to deliver atoms to the high voltage terminal of a dc. accelerator where they are converted to positive polarity and accelerated in a manner similar to that of a single ended dc accelerator. The disclosed method permits of a compact apparatus that does not require the use of negative ions, as do tandem-based accelerators, or the large power consumption of rf linacs and radio frequency quadrupoles. Neutral injection makes possible a compact implanter geometry that can include electrostatic scanning of the ions for individual wafer implantation.

Key Words

Integrated circuits, flat panel, implantation, deep wells, tubs, MeV implantation, gettering, latchup, neutral beams, semiconductor doping, ion implantation.

14 Claims, 10 Drawing Sheets

Single ended dc acceleration system multiple gap rf system

Tandem Accelerator magnification = $\ell_1/\ell_2$

MEV NEUTRAL BEAM ION IMPLANTER

BACKGROUND OF THE INVENTION

1. Field of the Invention

This invention relates to the controlled ion implantation doping and etch enhancement of semiconductor materials and flat panel displays by bombardment with ions having energies in the range 10 keV to 3 MeV.

2. Description of Prior Art

The doping of semiconductor materials by ion bombardment using ion energies between 200 keV and 3 MeV is commonly referred to as 'high energy' or 'MeV' implantation. MeV implantation allows the introduction of highly doped protective layers several microns beneath the active circuit layers that are commonly in or close to the surface of an integrated circuit.

For the manufacturing engineer, such submerged layers provide: (1) Processing simplicity and substantial reductions in the heat that has previously been essential to achieve deep diffusions; (2) Gettering of impurity atoms, a technique that often leads to remarkable reductions in device leakage currents; (3) Customization of memory and logic devices late in a manufacturing process cycle.

For the device designer, MeV implantation provides: (1) A capability for the independent tailoring of channel mobility; (2) The establishment of proper junction capacity; (3) A solution to the CMOS latchup problem; and (4) Electrical isolation of the circuits from the bulk of the silicon wafer for reduction of soft-error upsets.

At least three different accelerator techniques are being applied to generate the energies needed for MeV implantation. The principles of each are shown in FIGS. 1-3:

(1) A single ended dc acceleration system where the ion source is located within a megavolt high voltage terminal. Although simple, and used for research, such single ended systems have not been widely accepted as processing tools by the semiconductor industry because of ion source inaccessibility and limitations in space around the source.

(2) A multiple gap rf acceleration system operating in the frequency range 5-15 MHz using a 'Linear Accelerator' geometry. An example of an industrially accepted linac implanter is described by P. Boisseau, A. Dart, A. S. Denholm, H. F. Glavish, B. Libby and G. Simcox in *Nuclear Instruments and Methods in Physics Research*, Volume B21, page 285-295, (1987).

(3) A two-stage dc acceleration process where negative ions are injected at ground potential and accelerated to a high voltage terminal maintained at an electrical potential of the order 1 million volts. After conversion to positive polarity within this terminal, the ions are accelerated a second time back to ground for a final energy given by:

$$E_f = (1+q) \, eV_T$$

Here: $E_f$ is the final energy q is the charge state $V_T$ is the terminal voltage This use of the same acceleration potential twice, leads to the name "Tandem Accelerator". An example of an industrially accepted tandem implanter is described by N. Turner, K. H. Purser and M. Sieradzki in *Nuclear Instruments and Methods in Physics Research*, Volume B21, page 285-295 (1987).

3. Comparison of Accelerator Types:

Linac-type implanters: These devices have been widely accepted by the semiconductor industry. The ion acceptance phase acceptance of commercial linac implanters is such that 1-2 mA currents of particles having mass/charge ratio less than 75 can be accelerated to energies between 1-2 MeV for singly charged ions and multiply charged ions to higher energies. However, the power consumption to achieve peak energies, is substantial. As an example, the implant tool described by Boisseau, et al., above, requires a maximum connected power of 80 kVA. This figure does not include the energy needed for heat removal, consequential refrigeration and air conditioning.

Tandem-type implanters: These devices have also been widely accepted by industry. Compared to linacs, tandems have the advantage of lower power consumption, reduced cost and a wide mass and energy range. However, they suffer from the fundamental disadvantage that high intensity beams of negative ion of the wanted dopant species must be available. Species that produce negative ions weakly, or not at all, will not be usable as dopants. Fortunately, the two most important dopant atoms, boron and phosphorus, can be converted to negative ions fairly readily.

The negative ions used in the implanter described by Turner, et al. are prepared by charge-changing fast positive particles to negative polarity using interactions with molecules contained within a low pressure vapor cell. An example of such charge changing is described by J. P. O'Connor and L. F. Joyce in *Nuclear Instruments and Methods in Physics Research*, Volume B21, page 334-338 (1987). For the tandem implanter described by Turner, et al. the yield of negative ions from positive boron, phosphorus and arsenic ions at 35 keV are 10, 21, and 15%, respectively. When this yield is multiplied by the transmission efficiency of the tandem accelerator for ions entering a specific positive ion charge state (typically in the range 15-50% due to statistical fluctuations of electron removal from individual negative ions) the overall transmission efficiency between ions leaving the source and ions arriving at the implanted wafer is in the range 3-10%.

4. Future Directions

While both of the above implanter designs are used as production tools by industry, there are growing pressures for the development of MeV implanters having smaller footprints, lower power consumption and a broader range of dopants than those presently available from tandems. The present invention addresses these requirements and describes a compact, low cost, broad range implanter capable of producing ions at MeV energies.

There is also a trend in the semiconductor industry to move away from batch processing, where multiple wafers are processed simultaneously, to the processing of individual wafers. To achieve this, an implantation apparatus often employs 'hybrid scanning'. Here, the ion beam is rastered at high frequency in one direction, using triangular deflection voltages, and the wafer being implanted is moved through this 'ribbon beam' at an appropriate speed to acquire the necessary dopant concentration.

The apparatus to be described centers around an acceleration method that couples dc accelerator technology with the generation, focusing and transport of fast neutral atoms. In the present invention such neutral beams efficiently convey dopant atoms from ground to a high voltage terminal where they are converted to positive ions and are then accelerated back to ground using a single dc stage. Negative ion technology is not a prerequisite as the dopant atoms are transported through the accelerating electric fields as neutrals. In principle, all elemental species become available as high energy ions using well established positive ion source technology.

5. Historical Applications of Neutral Beams

The use of high energy neutral beams has a long history in nuclear structure research. In the late 1950's, High Voltage Engineering Corporation of Burlington, Mass., developed a compact neutral beam injector system as an add-on to allow helium acceleration by tandem accelerators. In the early 1960's, in an effort to extend the energy range of their large nuclear physics tandem accelerators, High Voltage Engineering Corporation developed neutral beam technology specifically for the hydrogen isotopes. The principles of these nuclear physics accelerators have been described by R. J. Van de Graaff in *Nuclear Instruments and Methods in Physics Research*, Volume 8 page 195–202, (1960).

More recently, in U.S. Pat. No. 5,300,891 Tokoro describes the use of a beam of neutral particles to extend the low-energy operating range of what is basically a tandem-type implanter that uses negative ions as the primary particles over much of its operating range. By having to transport positive, negative and neutral particles through the same vacuum acceleration tube structure, and with the neutral particles being limited to comparatively low energies, many of the advantages of neutral beam technology cannot be realized.

BRIEF DESCRIPTION OF THE DRAWINGS

Operation of the present invention may best be understood from the following detailed description thereof, having reference to the accompanying drawings, in which.

PRINCIPLES OF OPERATION

Figure 1:
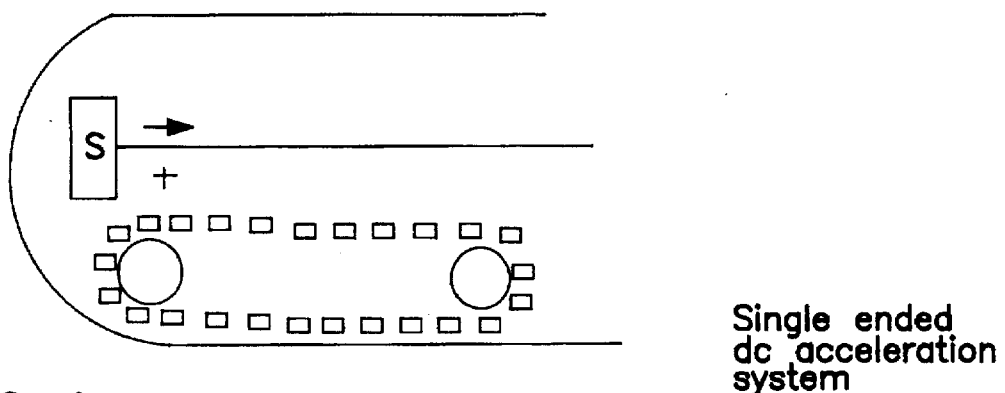
FIG. 1 shows schematically one accelerator technique that has been applied by semiconductor equipment manufacturers to impart MeV energies to charged particles.
Figure 2:
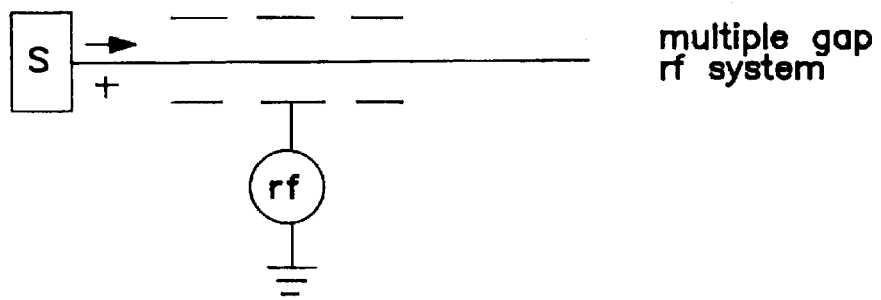
FIG. 2 shows schematically a second accelerator technique that has been applied by semiconductor equipment manufacturers to impart MeV energies to charged particles.
Figure 3:
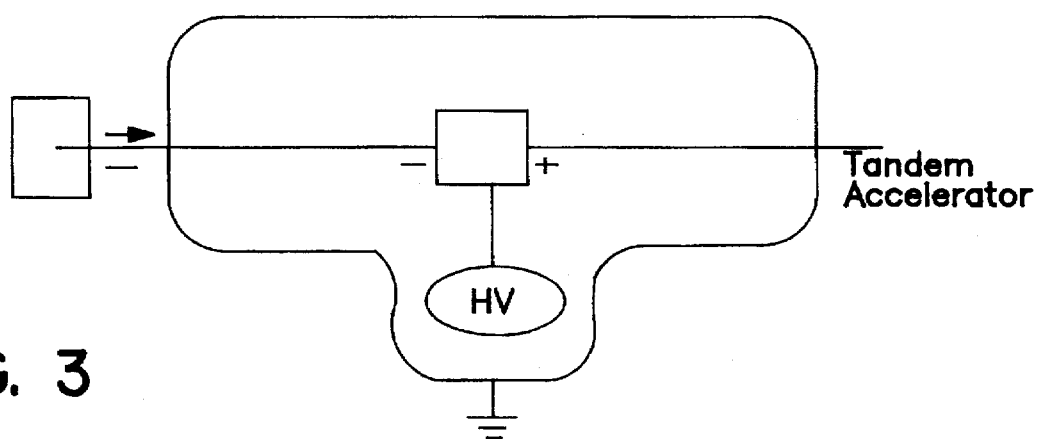
FIG. 3 shows schematically a third accelerator technique that has been applied by semiconductor equipment manufacturers to impart MeV energies to charged particles.
Figure 4:
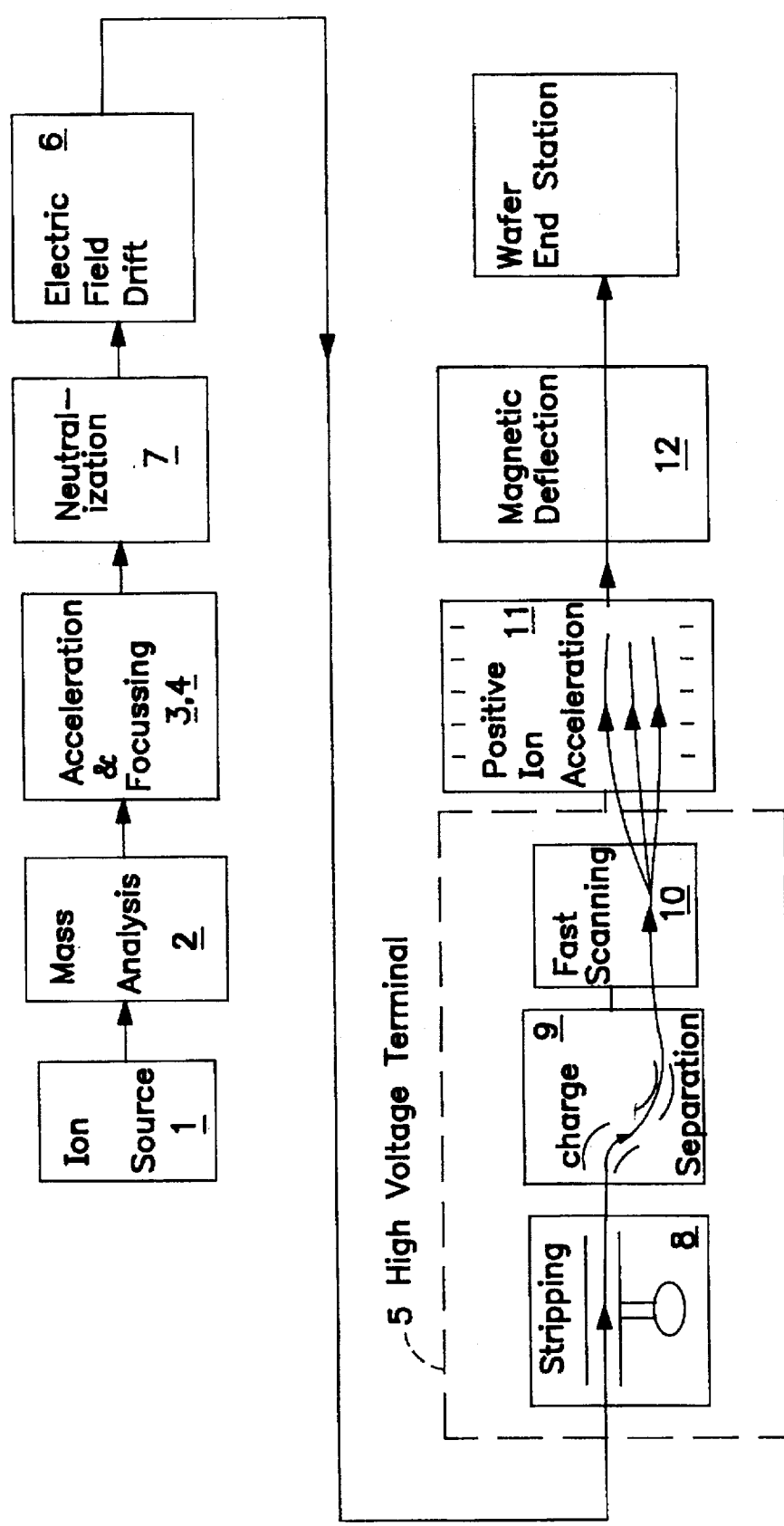
FIG. 4 shows a block diagram of the separate stages of a neutral beam MeV implanter according to the present invention.

Referring to the drawings and first to FIG. 4 thereof, therein is shown a block diagram showing the principles of the present invention.

Positive ions of the required dopant species are extracted from a suitable axially symmetrical ion source (1). Following mass analysis (2), the beam of selected ions is accelerated (3) and focused (4) to a beam waist at the center of the accelerator terminal (5) that is maintained at a positive potential up to about 1 million volts. Before entering the acceleration-field region (6) between ground potential and the terminal, the mass analyzed positive ions are focused to pass through a cell (7) containing a thin gas or vapor target where charge changing interactions cause a useful fraction of the incident ions to be converted to fast neutral atoms. These atoms continue along their original trajectories with little change in direction. As they are uncharged, the fast neutrals do not interact with the acceleration fields (6), and transit to the terminal with no change in energy or direction.

The insulated inclined field vacuum tube through which the neutral beam of atoms passes sweeps secondary particles out of the high voltage region preventing breakdown. The properties of such neutral beam transport tubes has been described by R. J. Van de Graaff, P. H. Rose and A. B. Wittkower, in *Nature*, Volume 1954, page 1292, (1962).

Thus, the inclined field acts to trap charged particles so that the inclined field vacuum tube transmits neutral particles, but not charged particles, along its length.

Because of the above focusing (4) the neutral beam reduces in size to a small diameter waist within the high voltage terminal. Here, these fast neutral atoms pass through a second gas or vapor cell (8), where the atoms are converted to a statistical ensemble of neutral particles and positive ions that are distributed among the positive charge states $1^+$, $2^+$, $3^+$, etc. that are populated in an established charge state distribution. The distribution functions for such interactions has been reviewed by A. B. Wittkower and H. D. Betz in *Atomic Data*, Volume 5, page 133–166, (1973).

Following the above electron stripping process within the high voltage terminal, the electric rigidity of these positive ions (energy/charge) is comparatively low. Moreover, the electric rigidity of ions in individual charge states is inversely proportional to the positive ion charge, so that at this location the electric rigidity spectrum consists of only a few well separated peaks. Thus, effective charge state separation becomes possible using compact electrostatic deflectors (9) within the high voltage terminal.

Using the same reasoning, that the electric rigidity of the ions is low within the high voltage terminal, a compact deflector (10) can be included here for the rastering deflections that are needed for hybrid scanning.

After leaving the high voltage terminal the positive ions are accelerated to ground by repulsion from the positive terminal arriving with a final energy given by:

$$E_f = E_n + q \cdot e \cdot V_t \qquad (1)$$

Here, $E_f$ is the final ion energy $E_n$ is the kinetic energy of the neutral beam atoms q is the charge state of the positive ions leaving the terminal $V_t$ is the terminal voltage e is the electronic charge Using a maximum terminal voltage of 1200 kV and a neutral beam energy of 150 keV, it can be seen that for ions having a charge state of q=1+ the maximum final energy is 1.35 MeV. For q=2+ the final energy is 2.55 MeV. It is believed that for semiconductor doping more than 75% of the MeV implant requirements will be satisfied by a device having such energy specifications.

Referring again to FIG. 4, the positive ion acceleration tube (11) transports the ions to ground.

Important features of such neutral beam MeV implanters are:

1) Final ion energies are available at useful intensities in the range 150–3000 keV.
2) The ion source can be based upon well established positive ion source technology
3) The ion source is located at ground potential allowing easy access for servicing.
4) The limitations and requirements for negative ion production are completely avoided.
5) There is no limitation on the mass of ions that can be accelerated. Any ion species that can be delivered by a positive ion source is, in principle, available for use as an MeV dopant.
6) While limitations are not inherent to the design, the maximum acceleration voltage needed is only ~1200 kilovolts. Thus, using high pressure $SF_6$ gas insulation, the acceleration section can be compact.
7) The transmission efficiency between positive ion source and implant location is 15–25%, a range that is intermediate between the transmission efficiencies of tandem and linac implanters.
8) The manufacturing cost for this new implanter is comparable to that of tandem systems.

DESCRIPTION OF THE PREFERRED EMBODIMENT

Figure 5:
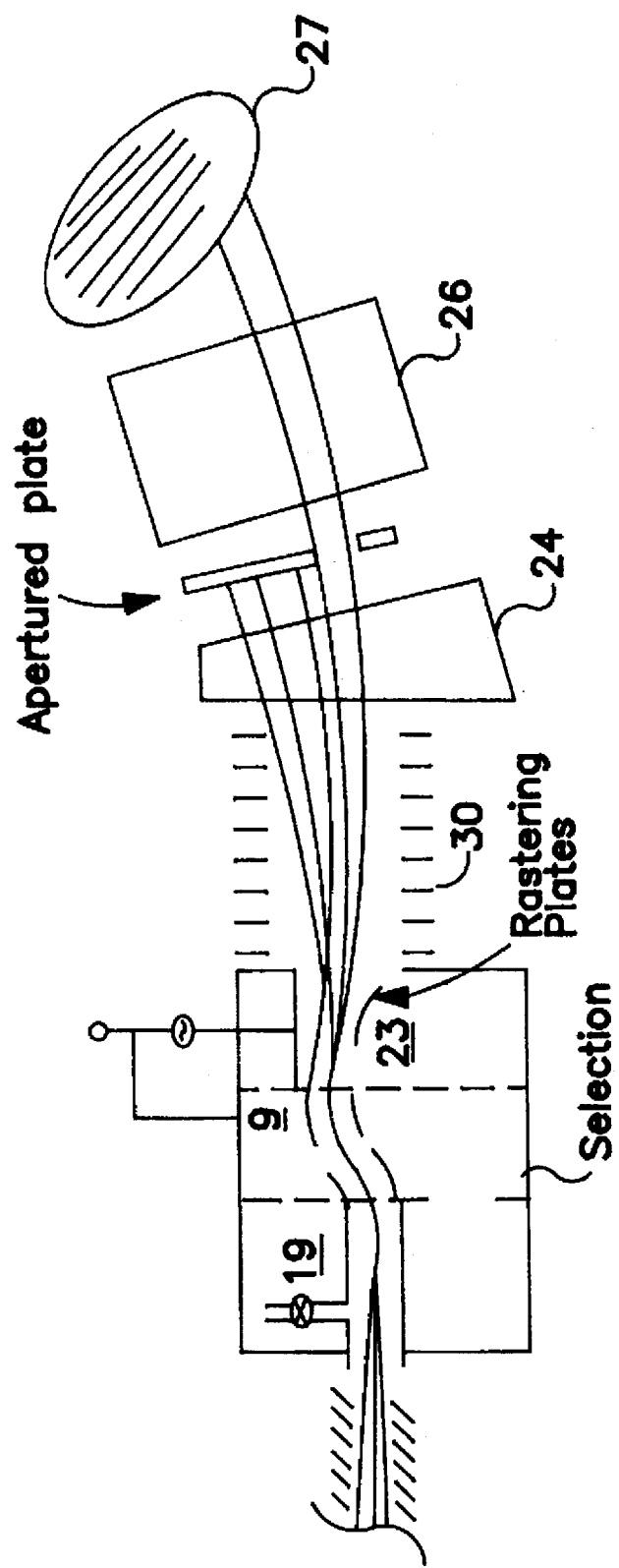
FIG. 5 shows one version of the preferred embodiment of the present invention.

The following section summarizes the operation of the preferred embodiment. Details of the embodiment can be seen with reference to FIGS. 5–7. Three examples are shown:

For the case of hybrid scanning, shown in FIG. 5, upon leaving the accelerator section the ions are deflected magnetically by a wedge shaped magnet (24) to correct for the non-parallelness introduced by hybrid scanning wave form. Finally, a small electrostatic deflection (26) in the plane at right angles to the scanning, acts as a neutral trap. A wafer holder (27) transports the wafer across the scanned ribbon beam.

Figure 6:
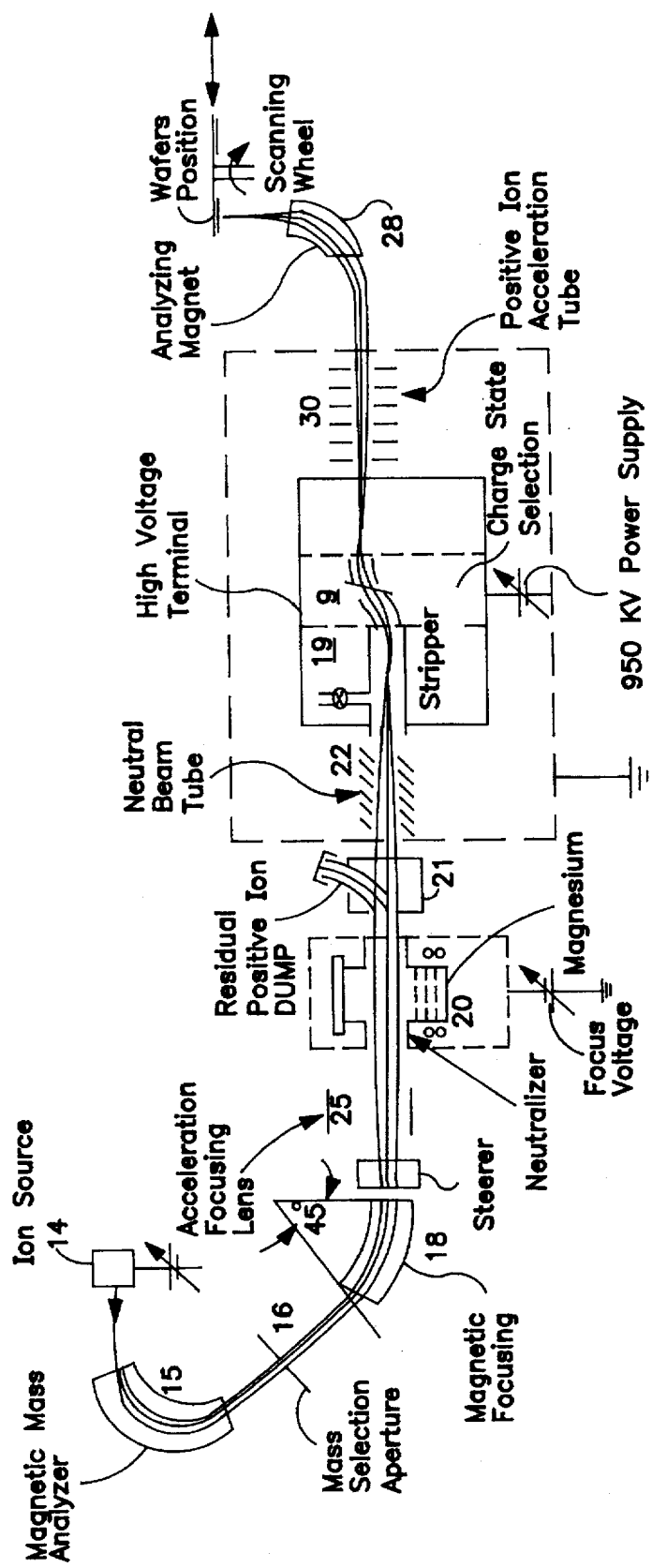
FIG. 6 shows a second version of the preferred embodiment of the present invention.
Figure 7:
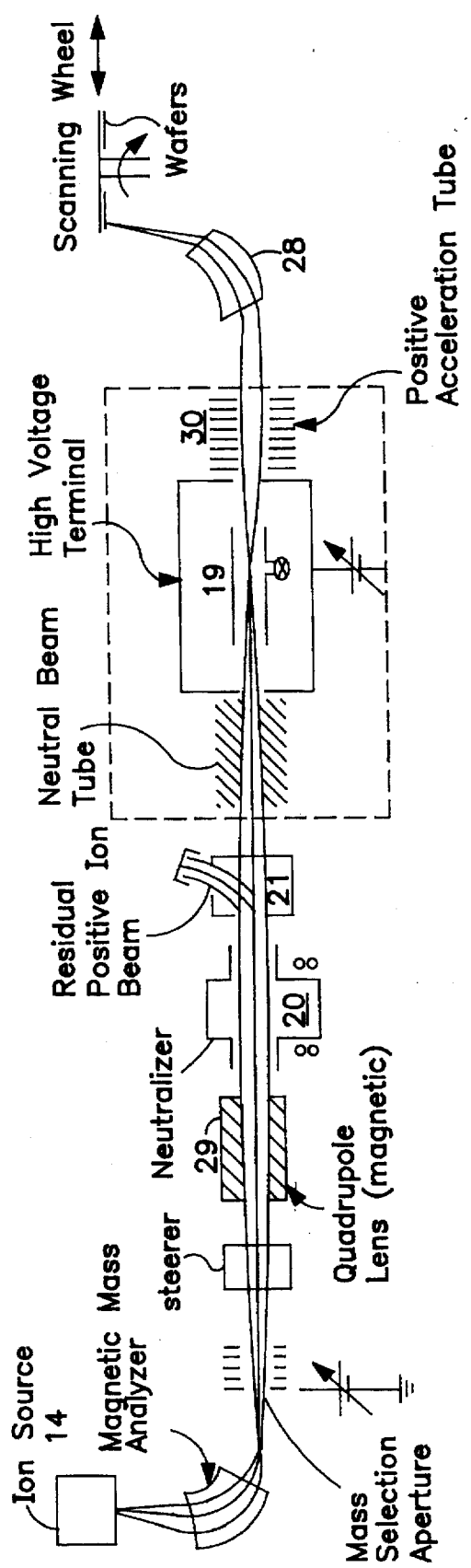
FIG. 7 shows a third version of the preferred embodiment of the present invention.

For the case where the beam must be stationary, shown in FIGS. 6 and 7, where the wafer is moved under the beam to achieve uniform doping, a 90-degree deflection magnet (28) is included for eliminating background particles and for directing the ions efficiently to the scanning wheel.

Positive ions are extracted and accelerated from a conventional axially symmetrical source (14) with an energy that is typically 95 keV. The ions are mass analyzed to remove almost all unwanted particles.

Figure 8:
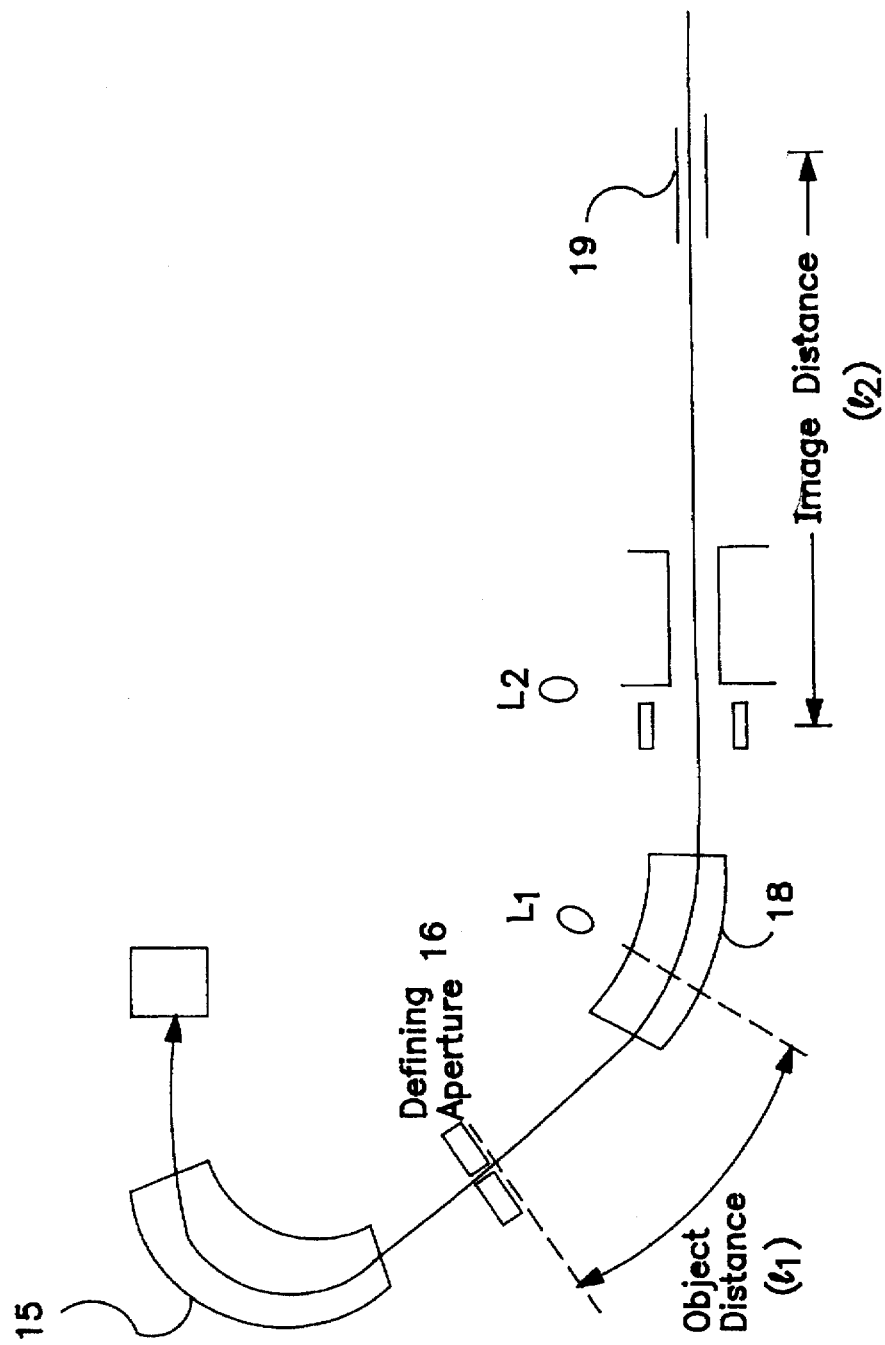
FIG. 8 shows a schematic of one analysis and focusing arrangement.
Figure 9:
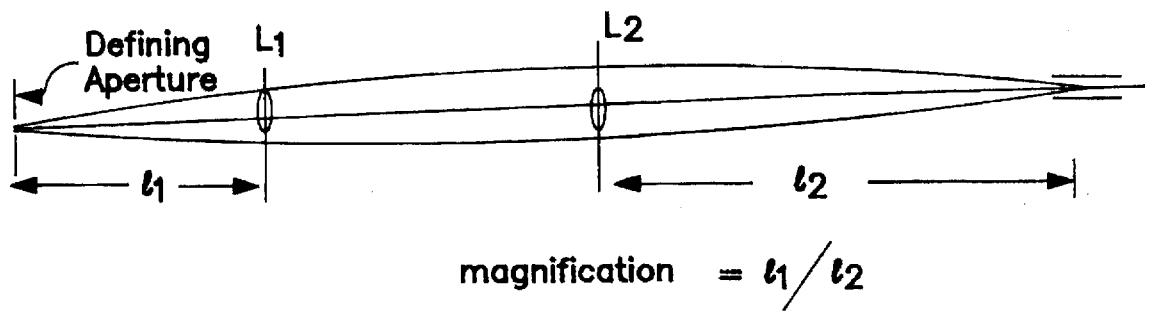
FIG. 9 shows the optical equivalent of FIG. 8
Figure 10:
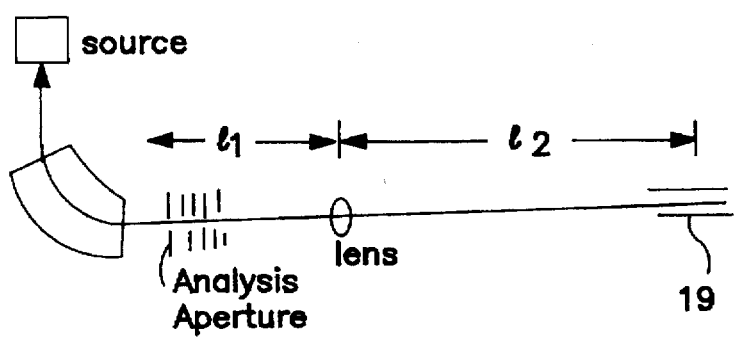
FIG. 10 shows a schematic of a second analysis and focusing arrangement.

FIGS. 8–10 are schematic diagrams showing two ways in which mass analysis and focusing for positive ions can be achieved using a combination of magnetic deflection and electrostatic acceleration. The first option (FIG. 8) describes a magnetic analyzer (15) having an angle of deflection for the wanted particles of 135 degrees. The second, FIG. 10, shows a 90 degree magnet at an elevated potential. In both cases substantially all of the ions have the same charge and energy so that the deflection angle is a function of ion mass. Thus, a mass spectrum is formed in the plane of the analysis aperture (16) and by changing the strength of the magnetic field of the analyzer any wanted mass can be deflected through the fixed defining aperture (16).

Since the ions passing through the above aperture (16) will generally be in the same charge state ($1^+$) and have substantially the same kinetic energy, they can be accelerated, if necessary, and focused to a substantially parallel or converging beam by a suitable electrostatic or magnetic lens. Those skilled in the art will recognize a variety of methods for achieving such focusing. The preferred embodiment for achieving this focusing effect is that these diverging ions leaving the mass defining aperture (16) are accelerated to an energy of approximately 150 keV and are then focused by a magnetic quadrupole lens (29).

An alternative preferred embodiment is that the ions passing through the mass defining aperture (16) enter a section of uniform magnetic field (18) which deflects the ions by approximately 45 degrees. By arranging that the distance between aperture (16) and the entrance to the magnetic field is approximately twice the radius of curvature of the ion trajectories in the median plane and by arranging that the entrance pole face is twisted by approximately 26.3 degree with respect to the normal to the beam direction, the ions leaving the above section of uniform magnetic field will travel along substantially parallel trajectories. The said distance between aperture and magnetic field corresponds to the object distance shown in FIG. 8. It should be as large as practical to minimize magnification at the stripper. The parallelness of the selected mass ions leaving the 45 degree magnetic deflector (18) is defined by the diameter of the above mass defining aperture and by the aberrations in the system. Those skilled in the art will recognize that proper shaping of the magnetic field can reduce the lens aberrations.

Figure 11:
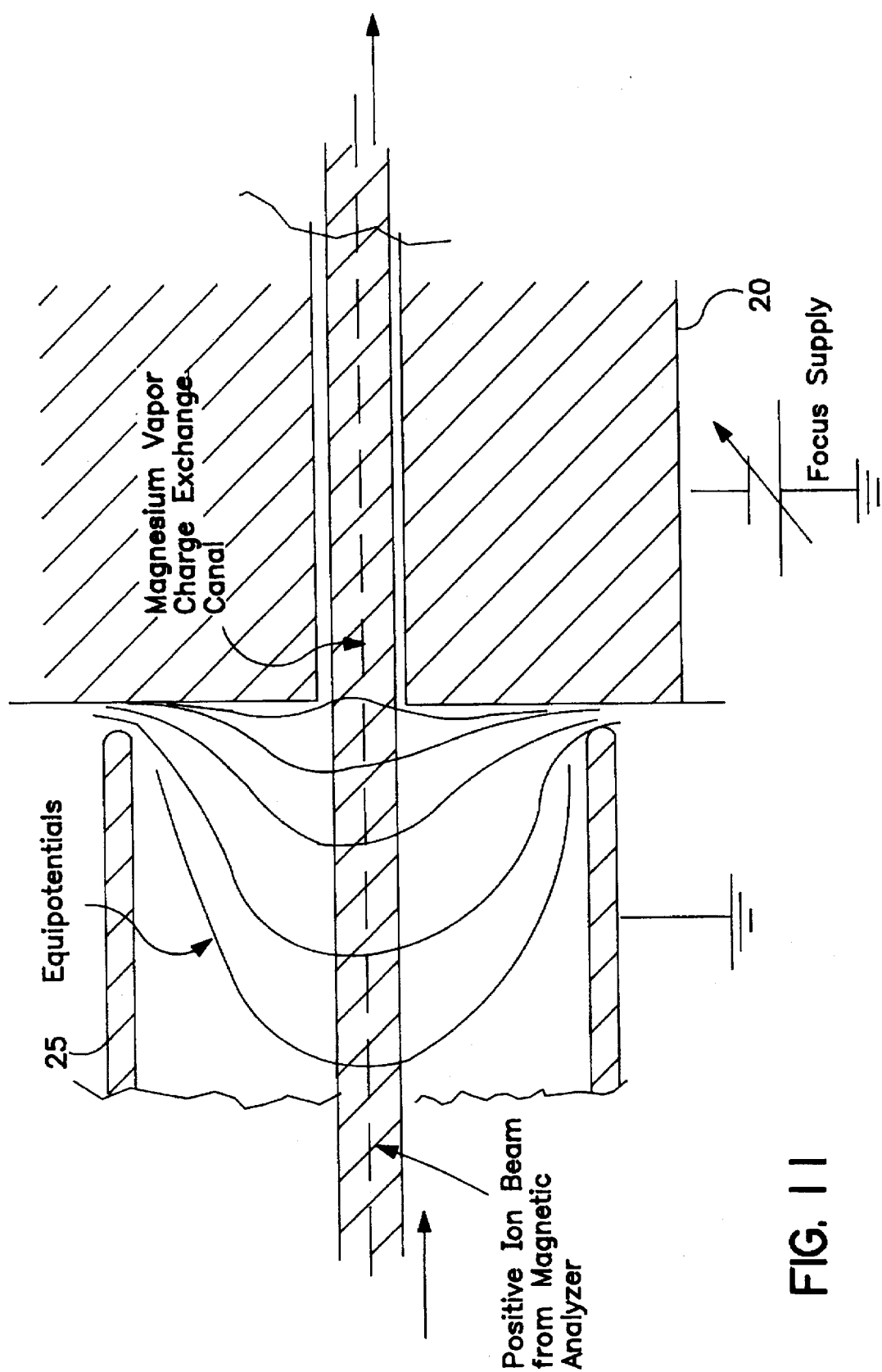
FIG. 11 shows a schematic diagram of the electrostatic focusing lens
Figure 12:
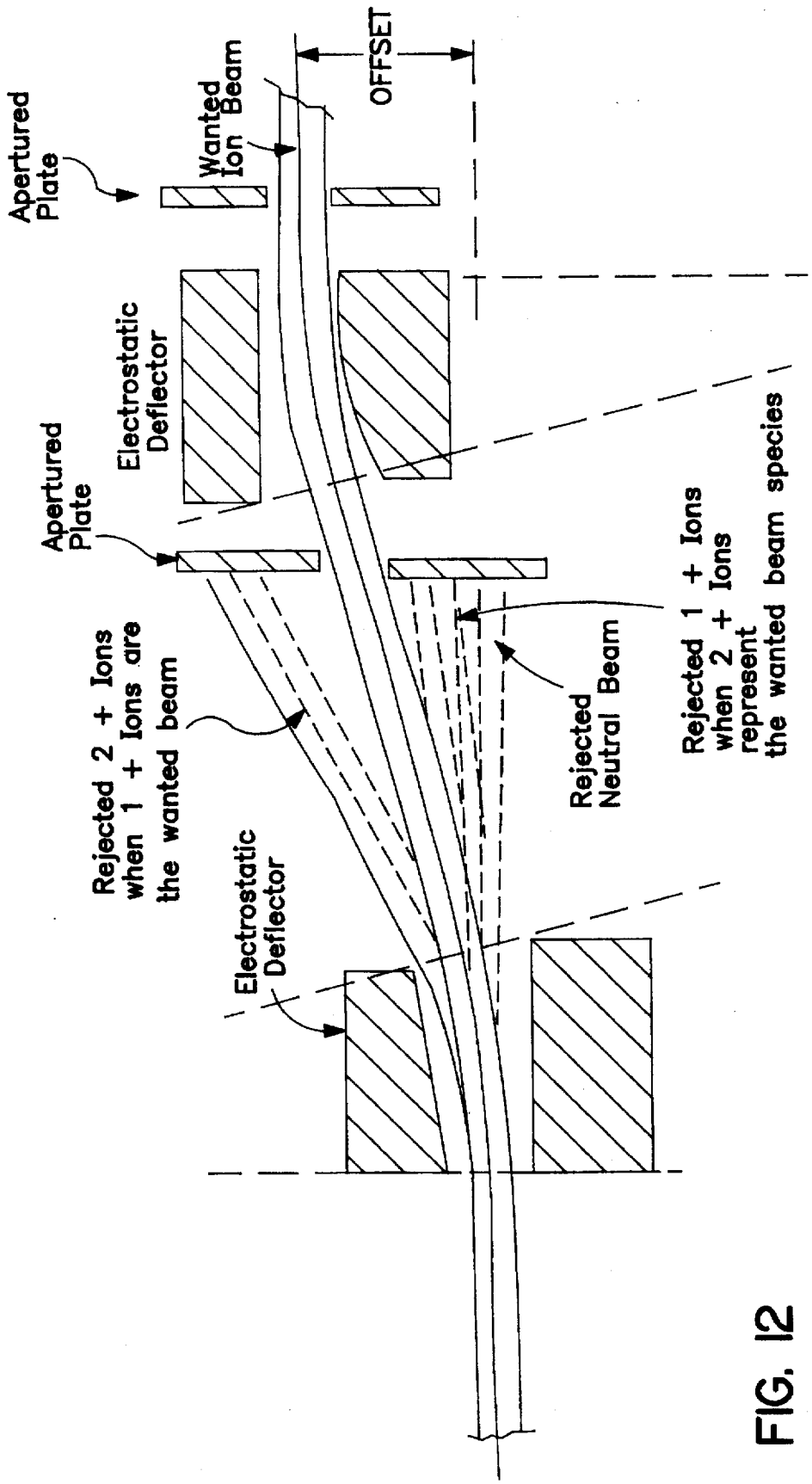
FIG. 12 shows the terminal charge-state separator.

A second focusing element in the alternative preferred embodiment provides the final variable focusing needed to direct the ions through the stripping canal (19) located within the high voltage terminal. FIG. 11 shows details of this electrostatic accelerating focusing lens (25). Within this lens the focusing fields are dominantly converging. Hence the aberrations are quite small for the energy ratios necessary to focus the parallel beam leaving the magnetic analyzing magnet through the terminal stripper. For the preferred embodiment where the positive ions are extracted from the source and accelerated to an energy of 95 keV before neutralization, the increase in energy necessary to produce the desired focusing is approximately 55 keV, resulting in a final energy of ~150 keV.

After focusing towards a waist at the center of the terminal stripping canal (19), the positive ions are directed through the charge neutralizer (20) whence a substantial fraction of the incoming ions are converted to fast neutral atoms. The conversion efficiency for such interactions has been reviewed in the above referenced article by A. B. Wittkower and H. D. Betz. From examination of tables in this article, which do not necessarily include the precise combinations of wanted ions and charge exchange media that might be needed for an MeV semiconductor implanter, it can be seen that for fast nitrogen atoms passing through an equilibrium thickness of nitrogen gas at an energy of 170 keV, the fractions of incident positive ions converted to neutral atoms is approximately 50%. It is expected that the conversion efficiency for both boron and phosphorus will be of the same order of magnitude if an appropriate gas is chosen. It is also known by those skilled in the art that the neutralization efficiency may be even higher and the small-angle scattering lower when a vapor, such as magnesium or sodium is used as a charge changing medium. In the preferred embodiment, a magnesium cell (20) is used. Because the vapor condenses on the walls of the apparatus and does not have to be pumped away using conventional vacuum pumps, such a cell can have large diameter entrance and exit tubes, allowing for good optical acceptance and high particle transmission. Also, because the binding energy of the valency electrons in Mg is lower than either boron or phosphorus (~7.6 eV), metastable states can be populated in the fast boron and phosphorus atoms making more efficient the succeeding stripping process which is needed to return the neutral atoms to positive ions in the terminal stripping canal (19).

An electric or magnetic deflector, (21), following the neutralizer, (20), eliminates the residual positive ions that have not been changed to neutral polarity and prevents them from entering the acceleration region.

The modified acceleration tube (22) needed for the transport of the fast neutral atoms between ground and the high voltage terminal does not require that the electric fields have a dominant axial field component. In fact, it is desirable that the electric fields be inclined at a significant angle to the tube axis. The purpose of introducing such an angle is to minimize the electron multiplication and breakdown effects that can be troublesome when scattered neutral particles strike the walls of the tube (22). The principles of this construction have been described in the above referenced article by R. J. Van de Graaff, P. H. Rose and A. B. Wittkower, and also by K. H. Purser, A. Galejs, P. H. Rose, R. J. Van de Graaff and A. B. Wittkower in *The Review of Scientific Instruments* volume 36, pages 453–457, (1965). Those skilled in the art will recognize that magnetic fields can also be included as suppression elements in the tube design to minimize the acceleration of secondary electrons.

When the fast neutral atoms reach the high voltage terminal and pass through the terminal stripping canal (19), they are stripped of at least one electron to become positively charged. The ensemble of ions leaving the canal will be distributed over charge states $0, 1^+, 2^+, 3^+, \ldots$ An examination of the above referenced article by Wittkower and Betz shows that helium is the most suitable gas for stripping the fast neutrals back to positive polarity. For fast boron atoms passing through helium gas with energies of order 150 keV, the equilibrium fraction is $1^+ = 66\%$, $2^+ = 23\%$. For phosphorus, the equilibrium fractions are: $1^+ = 40\%$, $2^+ = 50\%$. It is expected that both of the above $1^+$ yields will be increased somewhat by operating the stripping canal below equilibrium gas thicknesses.

Referring back to equation 1, it can be seen that the final ion energy depends directly upon the charge state of ions when they leave the stripper. Clearly, for energy purity only one charge state should be accelerated. In addition, any neutral particles that leave the stripper should be intercepted within the high voltage terminal and not be allowed to pass down the acceleration tube where charge changing in the residual vacuum can introduce background particles.

In principle, the elimination of unwanted charge states and neutrals is straight forward. (Certain features of this aspect of the invention are not claimed herein, but are claimed in my co-pending continuation-in-part application filed Feb. 21, 1997.) Immediately after conversion to positive polarity in the stripper all ions will have an energy of ~150 keV. Thus, the electric rigidity, energy/charge, (E/q), is substantially different from charge state to charge state and a small, straight-forward electrostatic deflection can be used to eliminate unwanted charge states. Those skilled in the art will recognize that there are many ways of making such charge state selections. FIG. 6 shows the preferred embodiment. A simple offset selects the wanted charge state and eliminates all other charge states and neutrals. The voltages on all elements are identical allowing the elements to be driven by a single power supply that is controllable from ground to permit charge state selection and thus energy selection.

Alternatively, as is shown in FIG. 7 all of the positive ions are accepted by the positive acceleration tube and are accelerated to ground potential. A bending magnet (28), which in the preferred embodiment deflects the wanted ions through 90 degrees, provides energy selection.

Figure 13:
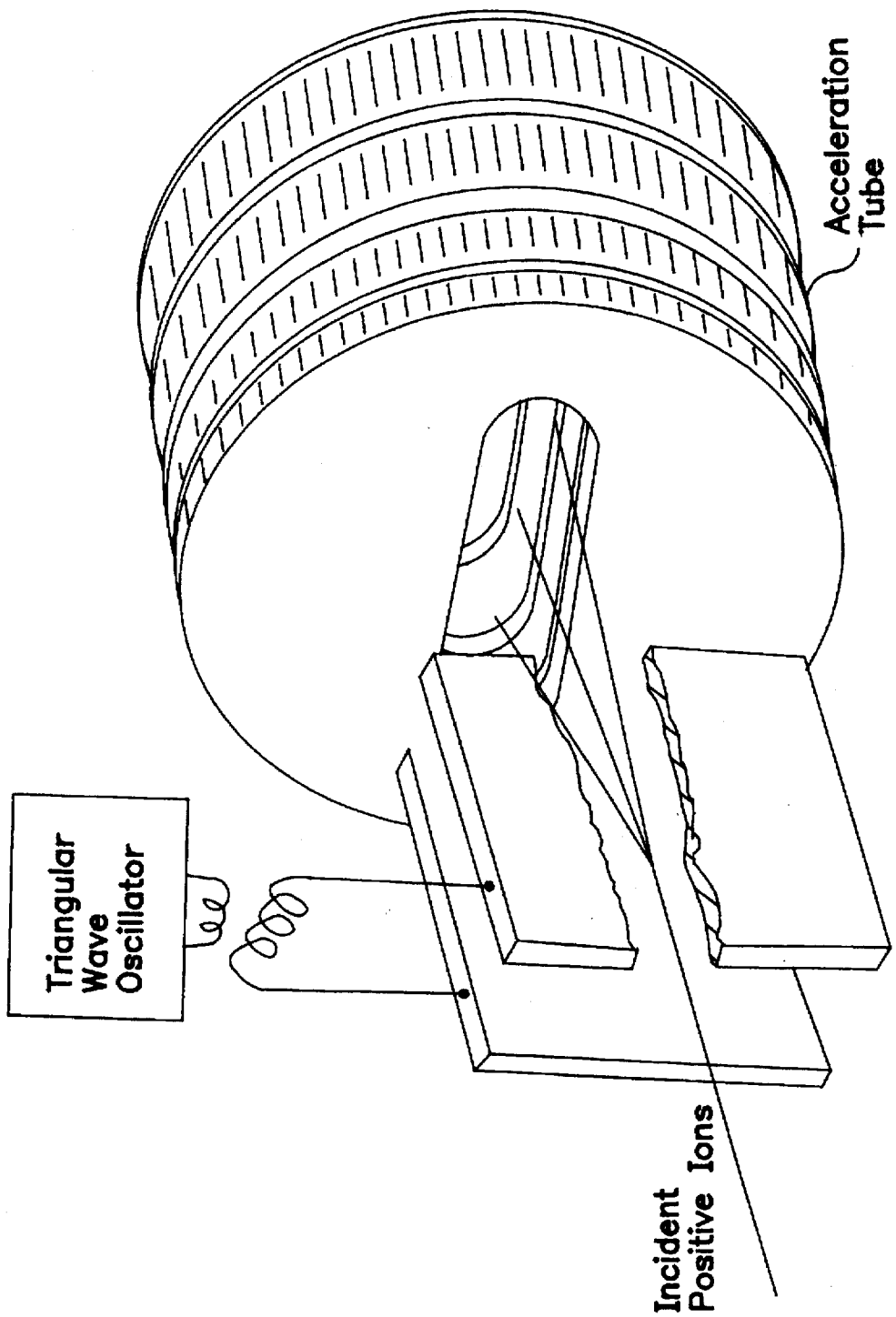
FIG. 13 shows the hybrid scanning raster apparatus.

For the situation where single wafer processing is desirable rastering is essential to satisfy the hybrid scanning requirement discussed earlier. The modification needed to accomplish this is shown in FIG. 5. FIG. 13 shows how this electrostatic deflection (23) can be compactly achieved within the high voltage terminal of the accelerator. An electrostatic deflector supplied with a computer generated voltage wave form, having substantially a triangular shape, deflects the ions to produce a uniform ribbon beam at ground. The attractiveness of this procedure is that the distance between the terminal and wafer is substantial. Thus, only small angles need be introduced to the ion beam to scan across a 200 mm wafer.

It can be seen from FIG. 13 that the ions are deflected along the slotted entrance to the acceleration tube (30). Within this acceleration robe the ions are returned to ground potential where they arrive with an energy given by equation 1 and with an angular spread of a few degrees from the scanning. This angular spread is linear from end to end of the sweep and can be reduced to almost zero by using a small angle magnetic deflection by passage of the ions at ground through a suitable magnetic field wedge.

In the preferred embodiment shown in FIG. 5 the final element in the single wafer beam transport system is a few degree electrostatic deflection (26). The deflector (26) introduces charge particle deflection in the plane at right angles to the preceding magnetic deflection (24). A suitable baffle eliminates neutral components that have been introduced by charge changing within the residual gas.

I claim:

1. An apparatus for the implantation of wanted atoms having specified energy to the near-surface regions of semiconductors or flat-panel displays comprising the following components in combination:

a source adapted to ionize said wanted atoms to form a first positive beam of wanted ions;

a high voltage inclined field tube adapted to transmit neutral particles, but not charged particles, along its length between ground potential and a terminal region maintained at an elevated positive electrical potential along said inclined field tube axis;

a deflection magnet adapted to focus said positive ions to a small transverse size at a point along said acceleration axis located at said elevated positive potential terminal;

a neutralizer which adds electrons to said focused positive ions to form neutral atoms;

a stripper at said elevated potential terminal through which said neutral particles are directed to remove electrons from said neutral particles to form a second positive ion beam;

a high-voltage acceleration tube adapted to accelerate said second positive ion beam to ground potential along second acceleration tube axis;

a means whereby said second positive ion beam is analyzed so that all positive ions comprising second positive ion beam that do not have substantially the specified energy are rejected;

a means whereby energy analyzed positive ions comprising second positive ion beam that have not been rejected above can be directed onto the surface of the semiconductor or flat-panel display.

2. The apparatus of claim 1 wherein the said ion source includes the following components:

a first aperture;

an electromagnetic analyzer adapted to deflect said positive ions comprising said positive ion beam and direct them so that only wanted species of said positive ions of ions having known energy pass through said first aperture.

3. The apparatus of claim 2 where the electromagnetic analyzer is a non-uniform magnet.

4. The apparatus of claim 1 wherein the electric fields within said high voltage inclined field tube include quadrupole components.

5. The apparatus of claim 1 wherein the said neutralizer comprises a windowless gas cell.

6. The apparatus of claim 1 wherein the said neutralizer comprises a windowless cell containing a condensable vapor.

7. The apparatus of claim 6 wherein the said condensable vapor comprises magnesium vapor.

8. The apparatus of claim 1 wherein the said neutralizer comprises a jet of vapor or gas.

9. The apparatus of claim 1 wherein the said focusing provided by said deflection magnet is augmented by an accelerating electrostatic lens.

10. The apparatus of claim 1 wherein the said deflection magnet includes quadrupole field components.

11. The apparatus of claim 1 wherein the said stripper at elevated potential through which said neutral particles are directed comprises a windowless cell containing non-condensable gas.

12. The apparatus of claim 1 wherein the said stripper at elevated potential through which said neutral particles are directed comprises a windowless cell containing condensable vapor.

13. The apparatus of claim 1 wherein the said neutralizer comprises a jet of vapor or gas.

14. A method of implanting wanted atoms having specified energy to the near-surface regions of semiconductors or flat-panel displays, comprising the following steps:

maintaining a terminal region at an elevated positive electrical potential, ionizing said wanted atoms to form a first positive beam of wanted ions;

deflection of said first positive beam of wanted ions using a suitable magnetic field that also focusses said positive ions to a small transverse size at a point within said terminal region, neutralizing said focused positive ions to form neutral atoms, transmitting said neutral atoms to said terminal region through a region that includes trapping fields for charged particles;

removing electrons from said neutral atoms to form a second positive ion beam, accelerating said second positive ion beam to ground potential, analyzing said positive ion beam to reject positive ions not having substantially the specified energy, and directing those positive ions that have not been rejected onto said near-surface regions.

\* \* \* \* \*